United States Patent
Mochizuki et al.

(10) Patent No.: US 10,600,694 B2
(45) Date of Patent: Mar. 24, 2020

(54) GATE METAL PATTERNING FOR TIGHT PITCH APPLICATIONS

(71) Applicant: International Business Machines Corporation, Armonk, NY (US)

(72) Inventors: Shogo Mochizuki, Clifton Park, NY (US); Alexander Reznicek, Troy, NY (US); Joshua M. Rubin, Albany, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 16/010,446

(22) Filed: Jun. 16, 2018

(65) Prior Publication Data

US 2018/0308767 A1    Oct. 25, 2018

Related U.S. Application Data

(62) Division of application No. 15/496,610, filed on Apr. 25, 2017, now Pat. No. 10,103,065.

(51) Int. Cl.
*H01L 21/8238*    (2006.01)
*H01L 29/06*    (2006.01)
(Continued)

(52) U.S. Cl.
CPC ...... *H01L 21/823842* (2013.01); *B82Y 10/00* (2013.01); *H01L 21/823878* (2013.01);
(Continued)

(58) Field of Classification Search
CPC ......... H01L 21/823842; H01L 29/4908; H01L 29/78696; H01L 29/42392;
(Continued)

(56) References Cited

U.S. PATENT DOCUMENTS 4,799,992 A    1/1989  Rao et al.
5,114,530 A    5/1992  Rao et al.
(Continued)

FOREIGN PATENT DOCUMENTS

CN    104124145 A    10/2014

OTHER PUBLICATIONS

Polishchuk, Igor, et al., "Dual Work Function Metal Gate CMOS Transistors by Ni—Ti Interdiffusion," IEEE Electron Device Letters, vol. 23, No. 4, Apr. 2002, pp. 200-202.
(Continued)

*Primary Examiner* — Nelson Garces
(74) *Attorney, Agent, or Firm* — Daniel P. Morris, Esq.; Hoffmann & Baron, LLP

(57) ABSTRACT

Gate metal patterning techniques enable the incorporation of different work function metals in CMOS devices such as nanosheet transistor devices, vertical FETs, and FinFETs. Such techniques facilitate removal of gate metal from one region of a device without damage from over-etching to an adjacent region. The fabrication of CMOS devices with adjoining nFET/pFET gate structures and having very tight gate pitch is also facilitated. The techniques further enable the fabrication of CMOS devices with adjoining gate structures that require relatively long etch times for removal of gate metal therefrom, such as nanosheet transistors. A nanosheet transistor device including dual metal gates as fabricated allows tight integration.

6 Claims, 8 Drawing Sheets

(51) Int. Cl.
*H01L 29/423* (2006.01)
*H01L 29/786* (2006.01)
*H01L 29/49* (2006.01)
*B82Y 10/00* (2011.01)
*H01L 29/40* (2006.01)
*H01L 29/775* (2006.01)
*H01L 27/092* (2006.01)

(52) U.S. Cl.
CPC ........ *H01L 29/0673* (2013.01); *H01L 29/401* (2013.01); *H01L 29/42376* (2013.01); *H01L 29/42392* (2013.01); *H01L 29/4908* (2013.01); *H01L 29/775* (2013.01); *H01L 29/78696* (2013.01); *H01L 21/823807* (2013.01); *H01L 27/092* (2013.01)

(58) Field of Classification Search
CPC ..... H01L 21/823878; H01L 21/823807; H01L 29/0673; H01L 29/66795; H01L 29/785; H01L 21/823431; H01L 27/0886; H01L 29/41791; H01L 21/823821; H01L 29/66545; H01L 29/66606; H01L 29/66871; H01L 27/092–0924
See application file for complete search history.

(56) References Cited

U.S. PATENT DOCUMENTS

| | | | |
|---|---|---|---|
| 7,005,716 | B2 | 2/2006 | Lin et al. |
| 7,078,278 | B2 | 7/2006 | Pan et al. |
| 7,485,961 | B2 | 2/2009 | Doan et al. |
| 7,514,310 | B2 | 4/2009 | Kim et al. |
| 7,569,466 | B2 | 8/2009 | Callegari et al. |
| 7,863,126 | B2 | 1/2011 | Park et al. |
| 8,030,716 | B2 | 10/2011 | Park et al. |
| 8,198,153 | B2 | 6/2012 | Zhu |
| 8,748,250 | B2 | 6/2014 | Xu et al. |
| 9,040,404 | B2 | 5/2015 | Ando et al. |
| 9,660,033 | B1 | 5/2017 | Chen |
| 2006/0273409 | A1 | 12/2006 | Lee |
| 2013/0105906 | A1 | 5/2013 | Yin et al. |
| 2016/0155660 | A1 | 6/2016 | Rananavare et al. |
| 2017/0005195 | A1 | 1/2017 | Ching |
| 2017/0294519 | A1 | 10/2017 | Khan |
| 2018/0261514 | A1* | 9/2018 | Xie .................. H01L 29/66545 |

OTHER PUBLICATIONS

English language translation of CN104124145A.

* cited by examiner

GATE METAL PATTERNING FOR TIGHT PITCH APPLICATIONS

CROSS-REFERENCE TO RELATED APPLICATIONS

This patent application is a divisional of U.S. patent application Ser. No. 15/496,610 filed Apr. 25, 2017, entitled "GATE METAL PATTERNING FOR TIGHT PITCH APPLICATIONS," the complete disclosure of which is expressly incorporated herein by reference in its entirety for all purposes.

BACKGROUND

The present disclosure relates generally to the electrical, electronic and computer arts and, more particularly, to gate metal patterning of structures including adjoining nFET and pFET regions and CMOS devices including dual metal gates.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease. In metal gate CMOS technology, two different metals can be employed as gate metal for p-type and n-type MOSFETs, respectively, each having a different work function for determining transistor threshold voltage. After blanket deposition of a first gate metal layer on both nFET and pFET regions of a structure, the first gate metal is selectively removed from one of the regions. A second gate metal is then deposited over the entire structure. The gate electrodes are then patterned.

Nanosheet FETs have been under development for possible use in tight pitch applications such as 7 nm nodes and beyond. Such FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs.

BRIEF SUMMARY

Techniques are provided for patterning gate metal formed on adjoining pFET and nFET regions.

In one aspect, an exemplary fabrication method includes obtaining a first structure including a substrate having a first region and a second region, a first FET structure on the first region of the substrate, the first FET structure including a semiconductor channel region and a dielectric layer adjoining the semiconductor channel region. The first structure further includes a second FET structure on the second region of the substrate, the second FET structure including a semiconductor channel region and a dielectric layer adjoining the semiconductor channel region, a first gate metal layer extending over the first and second regions of the substrate and adjoining the dielectric layers of the first and second FET structures, and a mask covering the first FET structure. The first structure is subjected to an etching process, thereby removing a first portion of the first gate metal layer from between the mask and the substrate, thereby forming a recess between the mask and the substrate, and partially removing a second portion of the first gate metal layer from the second FET structure while leaving a remaining portion of the first gate metal layer on the second FET structure. The fabrication method further includes sealing the recess, removing the remaining portion of the first metal gate layer from the second FET structure subsequent to sealing the recess, removing the mask subsequent to removing the remaining portion of the first metal gate layer from the second FET structure, and forming a second gate metal layer on the first and second FET structures, the second gate metal layer adjoining the dielectric layer of the second FET structure and having a different work function value than the first gate metal layer.

A further method of fabricating dual work function metal gate transistors includes obtaining a first structure including a substrate having a first region and a second region, a first FET structure on the first region of the substrate, the first FET structure including a semiconductor channel region and a dielectric layer adjoining the semiconductor channel region, a second FET structure on the second region of the substrate, the second FET structure including a semiconductor channel region and a dielectric layer adjoining the semiconductor channel region, a first gate metal layer having a first portion extending over the first region of the substrate and a second portion extending over the second region of the substrate, the first gate metal layer further adjoining the dielectric layers of the first and second FET structures, and a mask covering the first FET structure. The method further includes depositing a protective layer partially covering the first gate metal layer extending over the second region of the substrate and subjecting the first structure to an etching process subsequent to depositing the protective layer, thereby removing the second portion of the first gate metal layer while leaving the first portion of the gate metal layer intact. The mask is removed subsequent to removing the first gate metal layer from the second FET structure. A second gate metal layer is formed on the first and second FET structures, the second metal gate layer adjoining the dielectric layer of the second FET structure and having a different work function value than the first metal gate layer.

In another aspect, an exemplary monolithic structure includes dual work function transistor structures. The monolithic structure is comprised of a substrate having a first region and a second region. A first nanosheet field-effect transistor structure on the first region of the substrate includes a semiconductor channel region comprising a stack of nanosheet channel layers, gate dielectric layers respectively adjoining each of the channel layers, a first gate metal layer adjoining the gate dielectric layers, and a first portion of a second gate metal layer extending over the first gate metal layer. A second nanosheet field-effect transistor structure on the second region of the substrate includes a semiconductor channel region comprising a stack of nanosheet channel layers, gate dielectric layers respectively adjoining each of the channel layers, and a second portion of the second gate metal layer adjoining the gate dielectric layers, the second gate metal layer having a work function value different from the work function value of the first gate metal layer.

Techniques and structures as disclosed herein can provide substantial beneficial technical effects. By way of example only and without limitation, one or more embodiments may provide one or more of the following advantages:

Removal of gate metal from one of a pFET or nFET region while protecting the other region from gate metal loss;

Transistor threshold voltage control;

Facilitating fabrication of dense nanosheet transistor arrays;

Compatible with CMOS processing.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
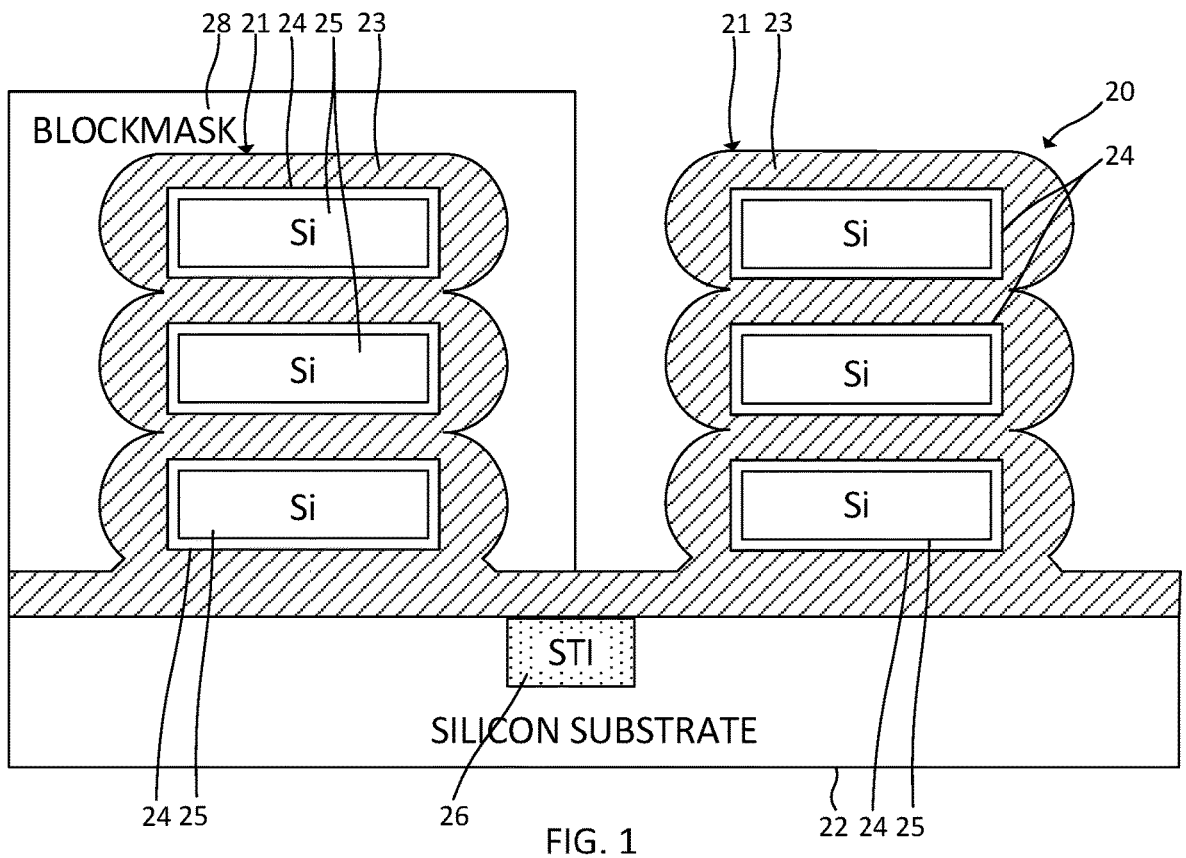
FIG. 1 is a schematic, cross-sectional view taken in a gate trench parallel to the gate and across nanosheets of a semiconductor structure including nanosheet FET structures in adjoining regions of a semiconductor substrate.

Steps for performing a first exemplary fabrication process are shown sequentially in FIGS. 1-6. The disclosed process may facilitate the fabrication of devices in the 7 nm mode and possibly beyond. FIG. 1 schematically depicts an exemplary semiconductor structure 20 including nanosheet field-effect transistor (FET) structures 21 formed on a semiconductor substrate 22 such as a bulk silicon substrate. The nanosheet FET structures 21 at this stage of the exemplary fabrication process include channel layers and associated gate stacks as well as doped source/drain regions which are not shown in the figures. (The figure shows a cross section along and inside of the gate; the doped source/drain regions accordingly are not shown.) The substrate may be divided into nFET and pFET regions, the nFET region including nFETs and the pFET region including pFETs upon completion of the fabrication process. A shallow trench isolation (STI) region 26 extending within the semiconductor substrate electrically isolates the nFET region from the pFET region. The nFETs formed in the nFET region(s) include n-type source/drain regions, for example phosphorus-doped silicon regions (not shown). In the region(s) wherein the FET structures 21 are to be functional as pFETS, the source/drain regions will be p-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorus. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C.

In one or more exemplary embodiments, the channel layers 25 of the nanosheet FET structures 21 each have a thickness in the range of four to ten nanometers (4-10 nm) and a width between five and one hundred nanometers (5-100 nm). The number of channel layers in each transistor 21 may vary depending on the desired uses and capabilities of the transistors. Nanosheet spacing between nFET and pFET regions (i.e. the distance between the inner edges of the nanosheets in adjoining regions) is between five and two hundred nanometers (5-200 nm) in some exemplary embodiments. The exemplary nanosheet FET structures 21 are gate-all-around (GAA) structures comprised of multiple nanosheet channel layers 25 with associated gate stacks. The channel layers 25 are comprised, for example, of monocrystalline silicon or silicon germanium.

Gate stack layers adjoin each channel layer 25. The gate stack layers each include a work function metal layer 23 such as TiN, TaN, TiC, TiAlC, TiSiN, TaSiN, TaC or HfN and a dielectric layer 24 such as HfO2, HfSiOx, SiON or other preferably high-k composition. The dielectric layer 24 may comprise a plurality of dielectric layers. A blockmask 28 is deposited on the structure 20 and patterned to expose one of the two regions on the substrate 22 while protecting the other during subsequent fabrication steps. An organic planarizing layer (OPL) is deposited and patterned to form the blockmask (or "mask") 28 in the first exemplary process. The material employed for forming the mask may be capable of reflow between two hundred and three hundred degrees Centigrade (200-300° C.) to facilitate the fabrication process, as described below. A polymethyl methacrylate (PMMA) photoresist film forms the mask 28 in one exemplary embodiment.

Figure 2A:
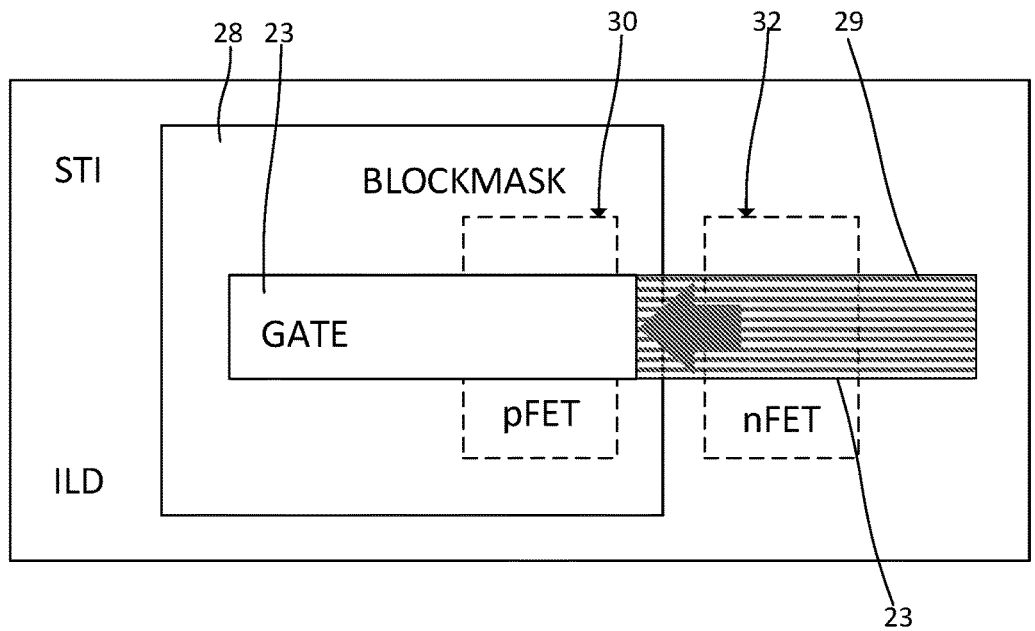
FIG. 2A is a schematic, top plan view thereof showing a first wet etch of a first one of the adjoining regions of the semiconductor substrate.
Figure 2B:
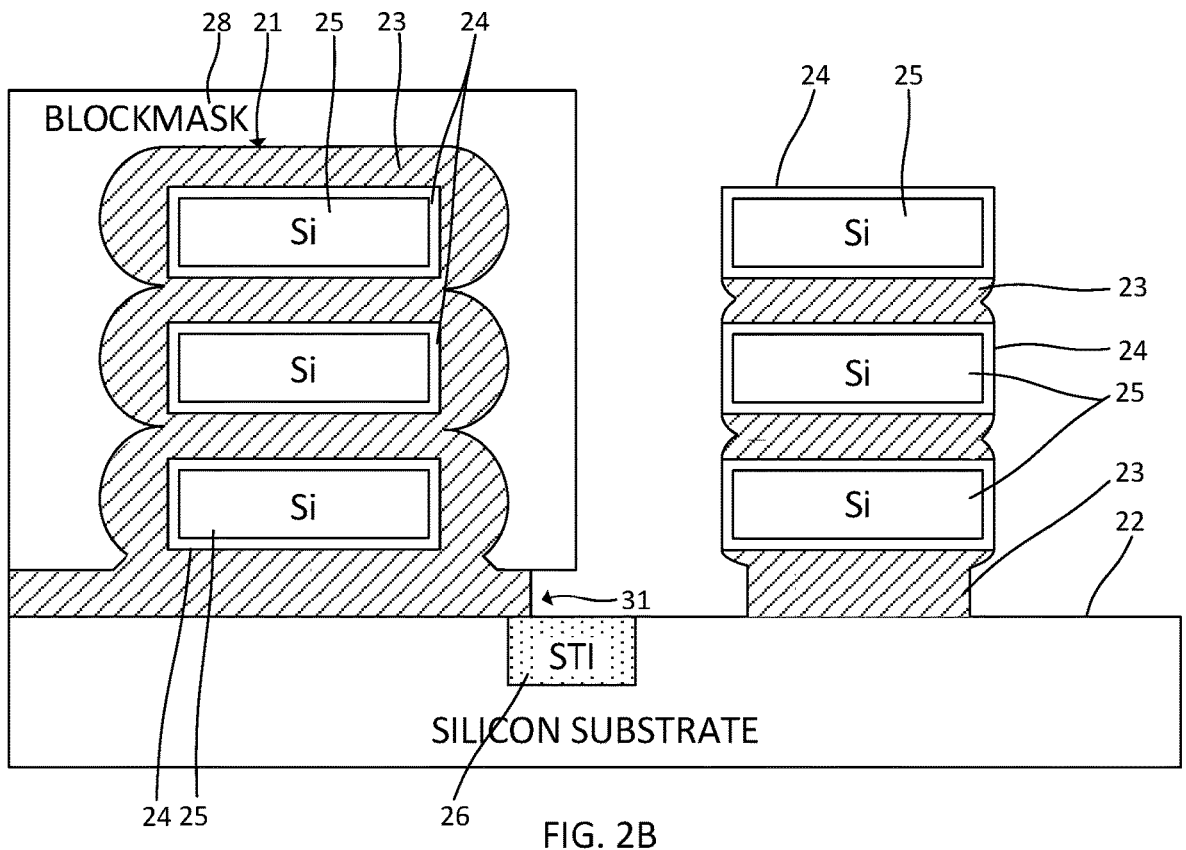
FIG. 2B is a schematic, cross-sectional view of the semiconductor structure following the first wet etch.
Figure 15:
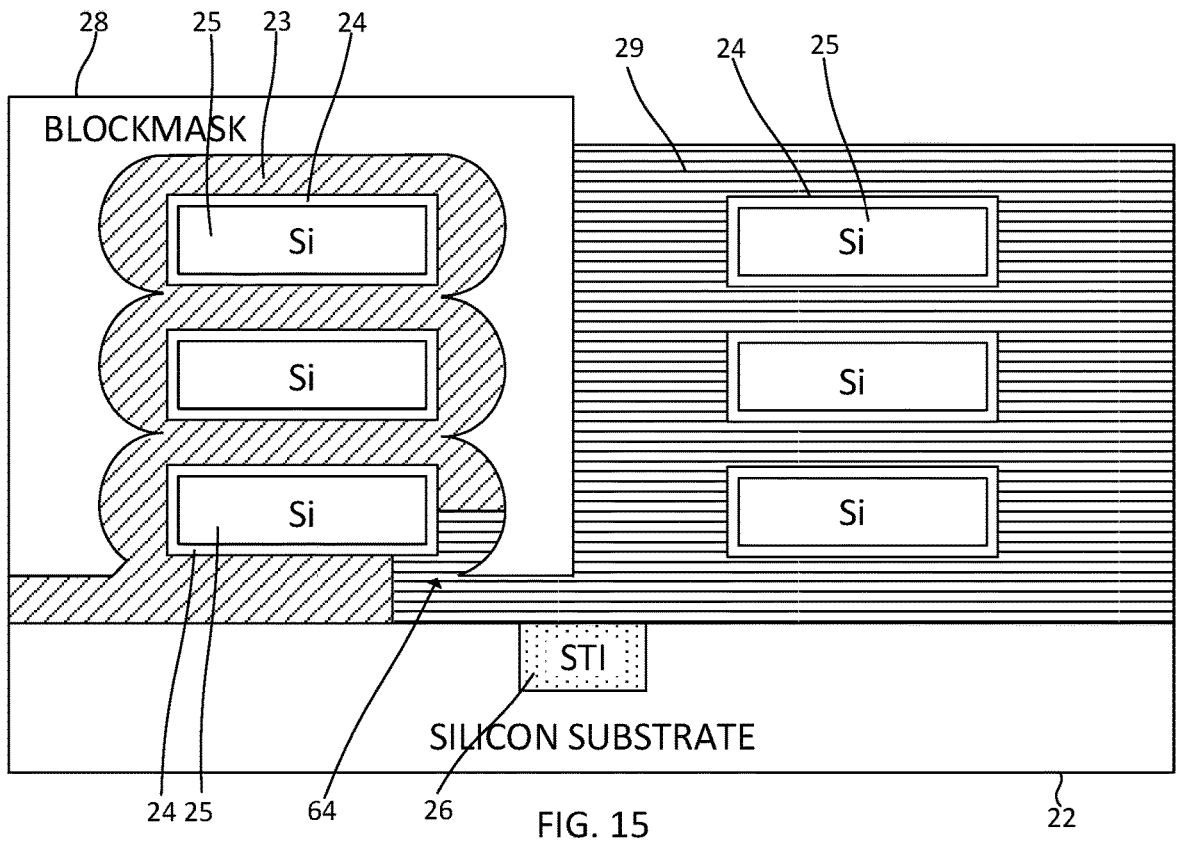
FIG. 15 is a schematic, cross-sectional view showing lateral etching of gate metal beneath the masked region of a semiconductor structure.

The structure 20 is subjected to a first wet etching process as schematically illustrated in FIG. 2A to remove, for example, five to ten nanometers of gate metal from the exposed region of the structure. In the exemplary structure shown in FIG. 2A, the etchant 29 removes gate material primarily from the nFET region 30 while the pFET region 32 is protected by the mask 28. The first etching process causes only a portion of the gate metal layer 23 to be removed in the nFET region. Removal of all gate metal from the nFET region 30 in a single etching step would also possibly cause the lateral etching of gate metal in the protected pFET region 32 as the etchant 29 proceeds under the mask in the direction of the pFET region, as indicated by the arrow in FIG. 2A. As schematically illustrated in FIG. 15, a long etch sufficient to remove all the metal between nanosheet channel layers 25 and on the sides thereof may also lead to the etchant 29 removing metal between the substrate 22 and the mask 28 and further etching gate metal away from the protected transistor as shown in the area designated by numeral 64. If the nanosheet channel layers 25 have widths of fifty nanometers, about twenty-five nanometers of metal need to be etched from each side plus the additional metal forming the sidewalls of the structure. Such over-etching can lead to undesirable gate metal loss from the blocked region and possible device failure. In contrast, the partial etch conducted in the exemplary fabrication process causes only a slight under-etching of the metal layer 23 beneath the mask 28, as schematically illustrated in FIG. 2B. Limited under-etching that causes the formation of a recess 31 beneath the mask 28 and above the STI region 26 is preferred. The metal layer 23 as originally formed may have a thickness of about five nanometers (5 nm) in the substrate/STI area between the nanosheet FET structures 21 in adjoining regions. As further shown in FIG. 2B, the partial etch may remove all of the gate metal on the outer surfaces of the FET structure 21 in the exposed region on the right side of the structure while most of the metal between channel layers 25 and between the bottom channel layer 25 and the substrate 22 in this region remains.

Figure 3:
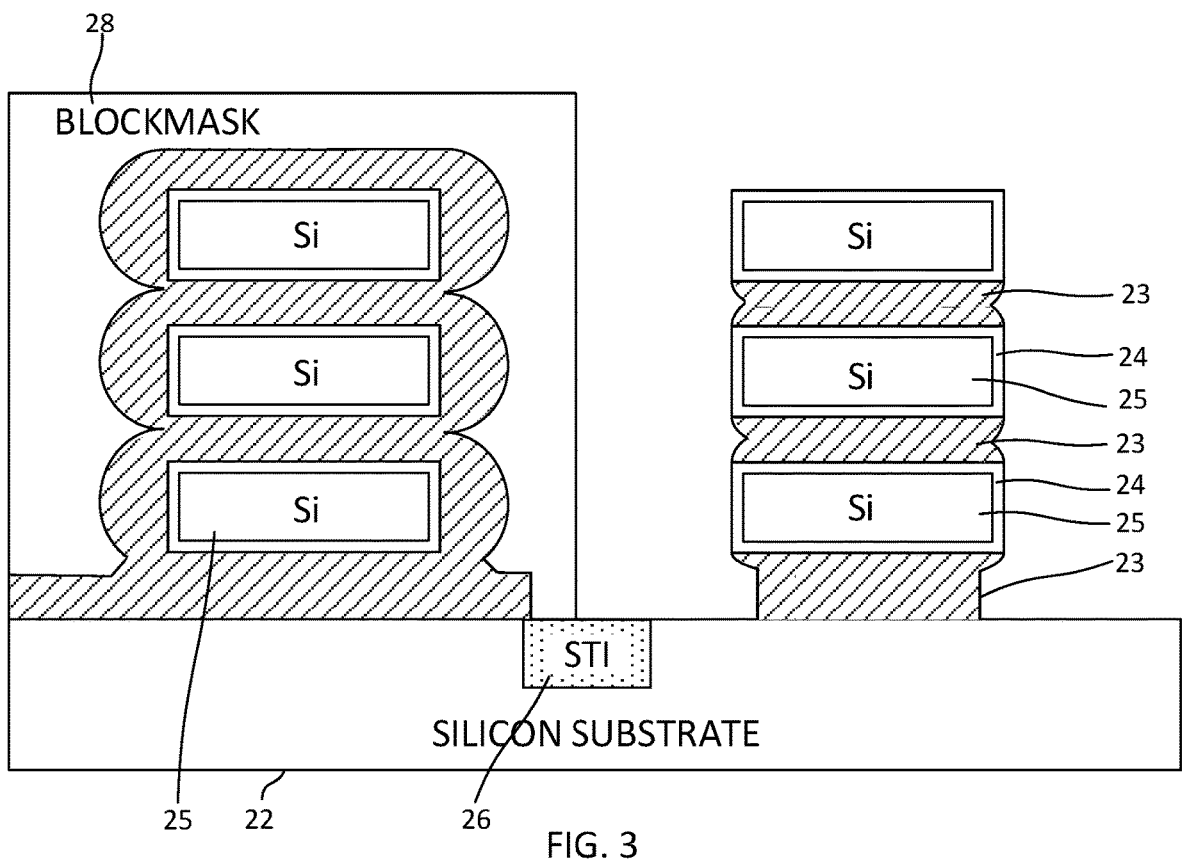
FIG. 3 is a schematic, cross-sectional view thereof following reflow of a mask layer on a second one of the adjoining regions of the semiconductor substrate.

Referring now to FIG. 3, the resulting structure is heated to reflow the mask 28, thereby sealing the recess 31 between the mask 28 and the STI region with mask material. In some embodiments, the temperature is maintained slightly below the glass transition temperature of the mask material during reflow. Use of the OPL mask allows reflow between 200-300° C., which will not adversely affect the nanosheet FET structures 21. Reflow temperature and time is controlled to avoid the flow of mask material into the exposed region where it could impede further etching of the work function metal within the FET structures therein. The surface tension of the mask material is maintained to a sufficient extent during reflow to prevent unwanted flow of the mask material. Specific reflow parameters depend on the chosen mask material.

Figure 4:
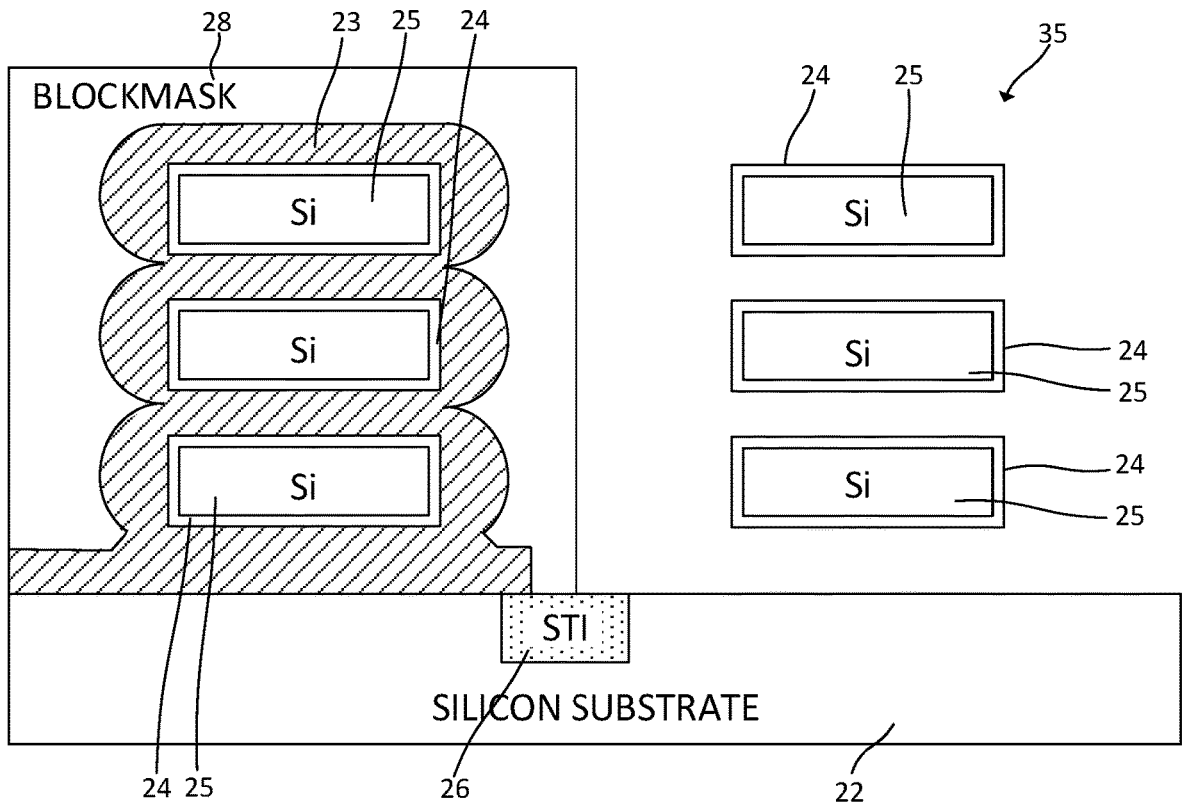
FIG. 4 is a schematic, cross-sectional view thereof following a second wet etch of the first one of the adjoining regions of the semiconductor structure.

The mask 28 is cooled following reflow and a second wet etch is thereafter conducted to remove the remaining gate metal from the unprotected region of the substrate. Because the protected region is completely sealed by the mask following mask reflow, the gate metal under the mask is unaffected by the second wet etch. A structure 35 as schematically illustrated in FIG. 4 is obtained. The surfaces of the dielectric layers 24 on the semiconductor channel layers 25 in the unprotected region and the top surface of the substrate 22 are completely exposed following the second wet etch. In embodiments wherein the gate metal layer 23 is a titanium nitride layer, a standard basic SC1 solution (12.5% ammonium hydroxide solution, 12.5% hydrogen peroxide solution, and 75% water) can be used to selectively etch the gate metal layer at room temperature. The etchant chosen should be highly selective with respect to the removal of the high-k dielectric material 24 lining the channel layers 25, the STI material, and the semiconductor material comprising the substrate 22.

Figure 5:
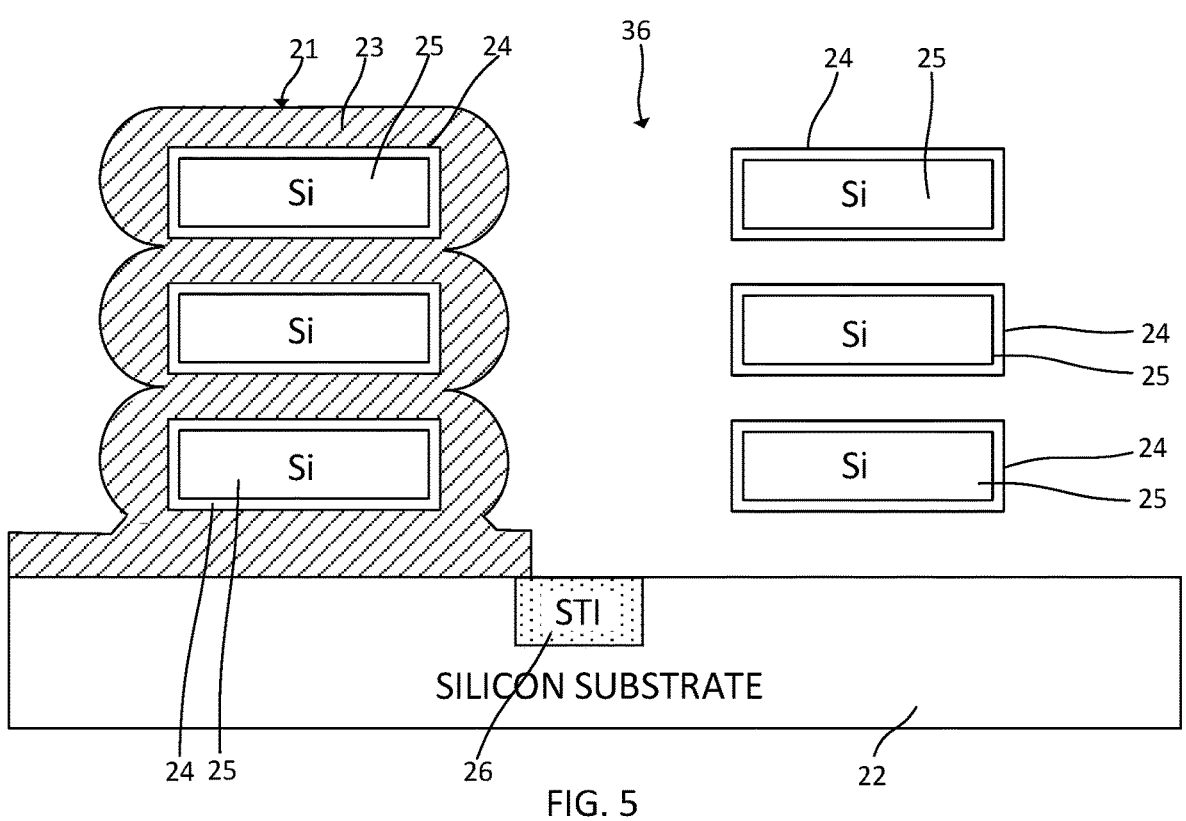
FIG. 5 is a schematic, cross-sectional view thereof following removal of the mask.
Figure 6:
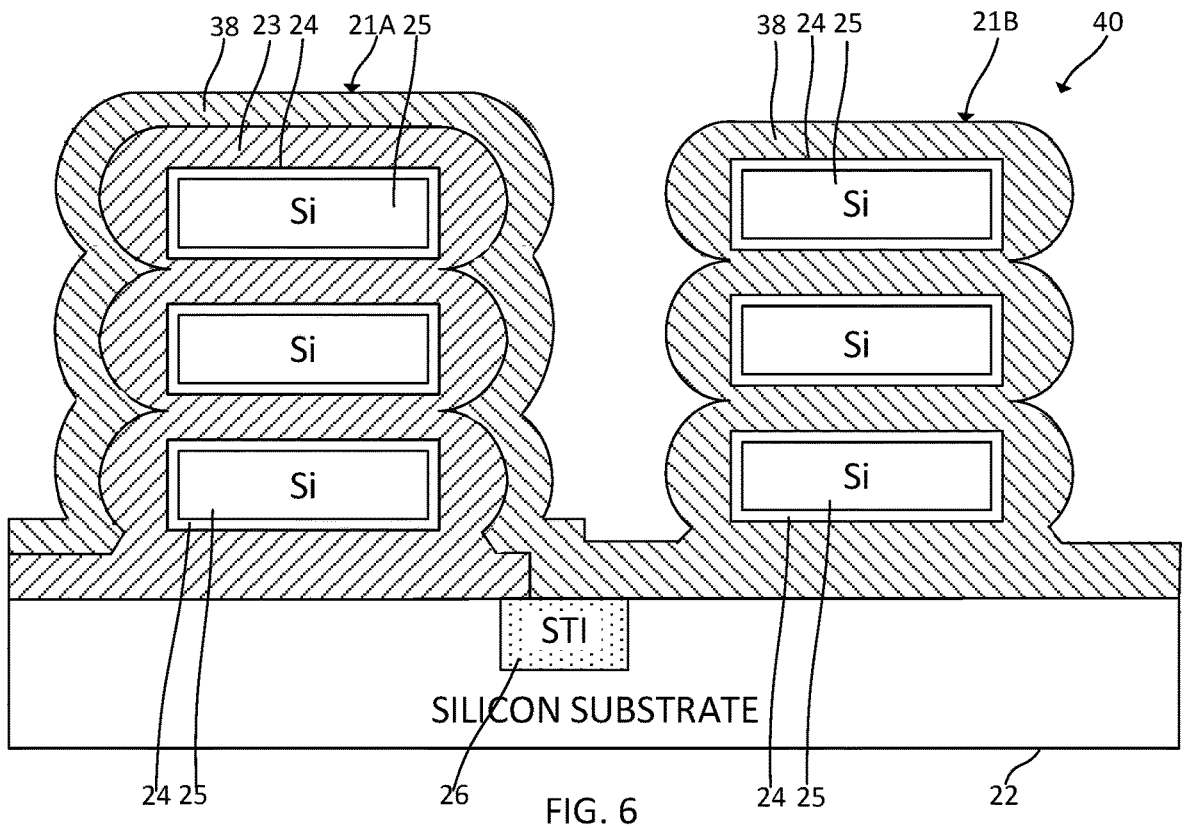
FIG. 6 is a schematic, cross-sectional view thereof following deposition of a metal layer on the semiconductor structure shown in FIG. 5.

The mask 28 is removed by ashing or other suitable process to obtain a structure 36 having exposed nFET and pFET regions as schematically illustrated in FIG. 5. A second metal layer 38 having a higher or lower work function than the first metal layer 23 is then deposited on the structure 36 to form a structure 40 as schematically illustrated in FIG. 6. Both metal layers 23, 38 can be deposited using any suitable deposition process, for example, atomic layer deposition. The FET structure 21A in one of the two regions (for example the pFET region) includes two work function metal (WFM) layers 23, 38, the first of which adjoins the gate dielectric layer 24, while the FET structure 21B in the other region (for example the nFET region) includes only one WFM layer 38. It will be appreciated that either or both metal layers 23, 38 may include a single layer made from a single WFM or multiple layers made from different WFMs. In one embodiment, the first metal layer 23 is TiN and the FET structure 21A is a pFET while the FET structure 21B is an nFET and the second metal layer 38 adjoining the gate dielectric layer 24 of the nFET structure 21B has a work function value that differs from that of TiN. In some embodiments, the threshold voltages of the FET structures 21A, 21B are substantially the same.

Figure 7:
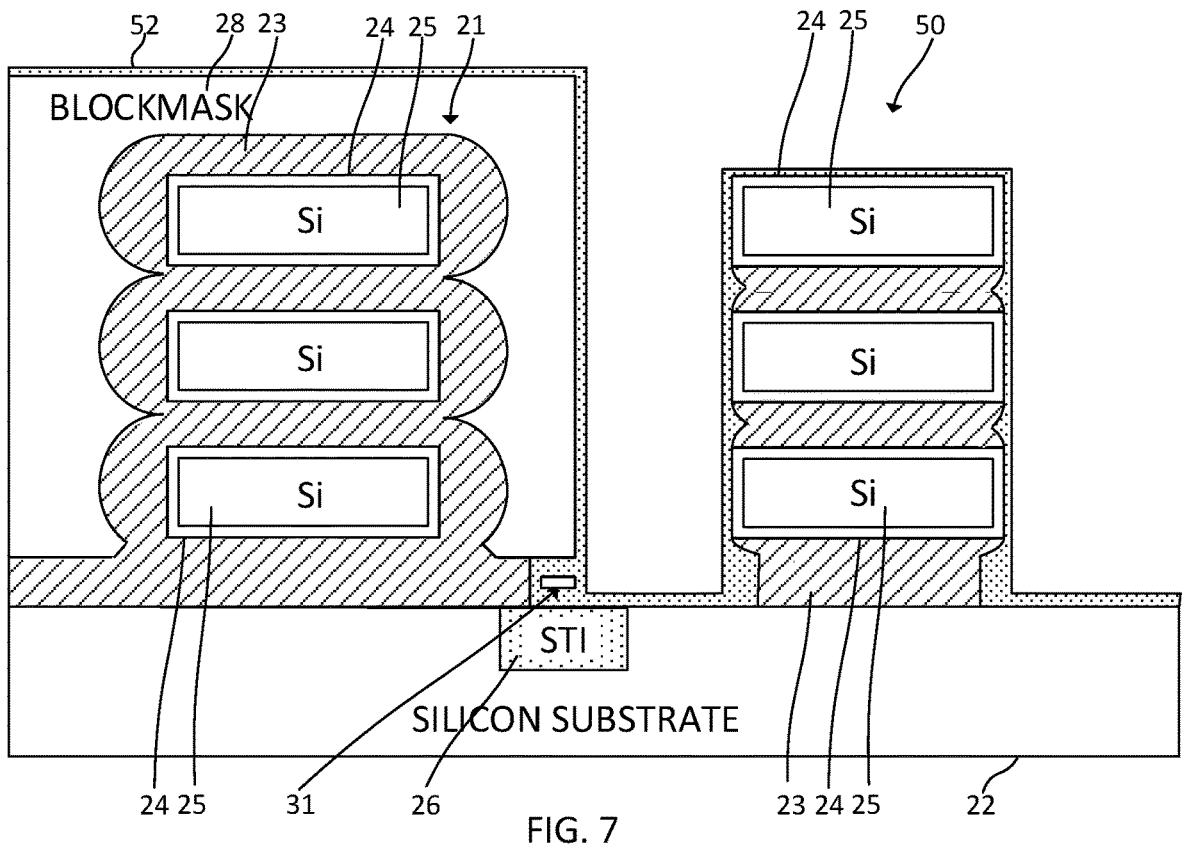
FIG. 7 is a schematic, cross-sectional view showing the structure of FIG. 2B following deposition of a liner thereon.

Steps included in an alternative fabrication method are schematically illustrated in FIGS. 7-11. The same reference numerals employed with respect to FIGS. 1-6 are used in FIGS. 7-11 to identify similar elements. Prior to forming the structure 50 shown in FIG. 7, the steps described above with respect to FIGS. 1-2B are performed. Once a structure as shown in FIG. 2B is obtained, a liner 52 is formed thereon. In one exemplary embodiment, the liner is a silicon dioxide layer having a thickness of several nanometers. Oxides other than silicon dioxide could alternatively be formed on the structure. Atomic layer deposition (ALD) is employed to form the liner 52. As discussed previously, the thickness of the metal layer 23 above the STI region may, prior to the first metal etching process described above, be about five nanometers. The height of the recess 31 formed beneath the mask 28 is substantially the same as the thickness of the portion of the metal layer 23 that has been removed from beneath the mask. The deposited oxide layer will pinch off and block the opening to the recess, as schematically illustrated in FIG. 7.

Figure 8:
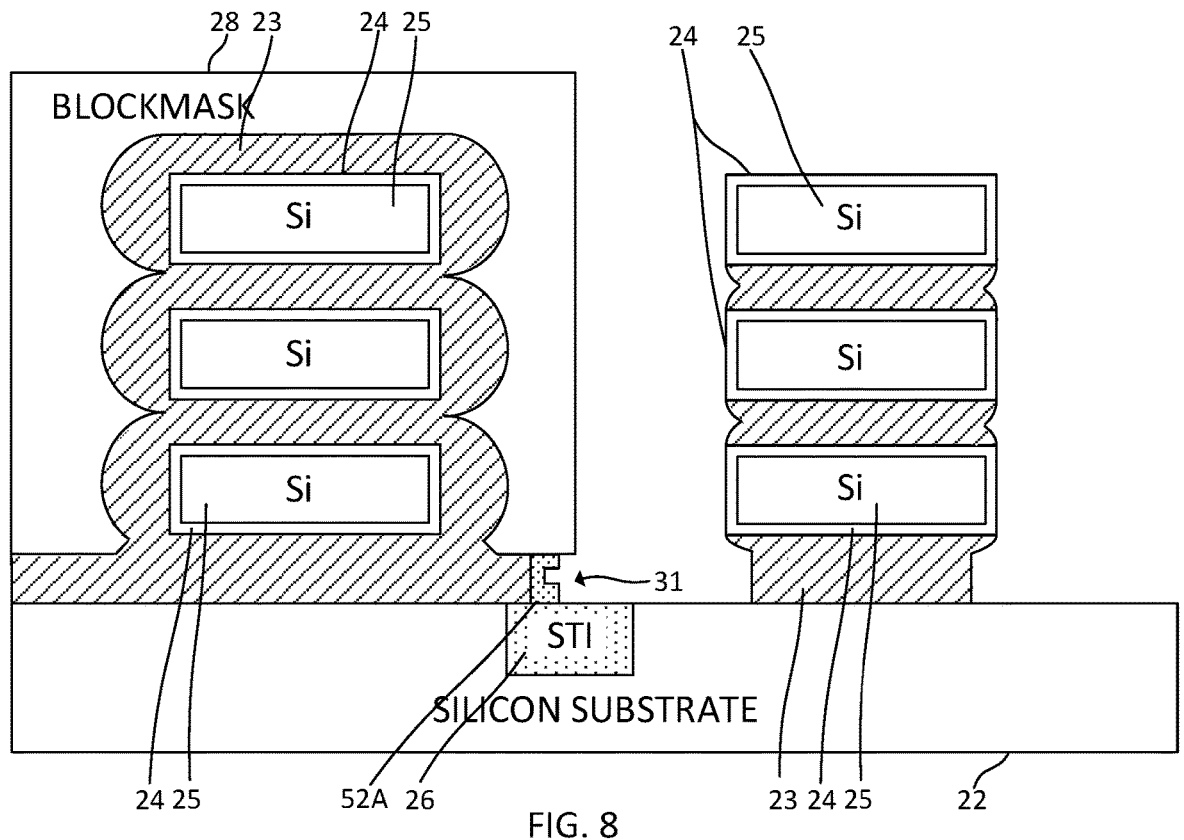
FIG. 8 is a schematic, cross-sectional view thereof following etching of the liner material.
Figure 9:
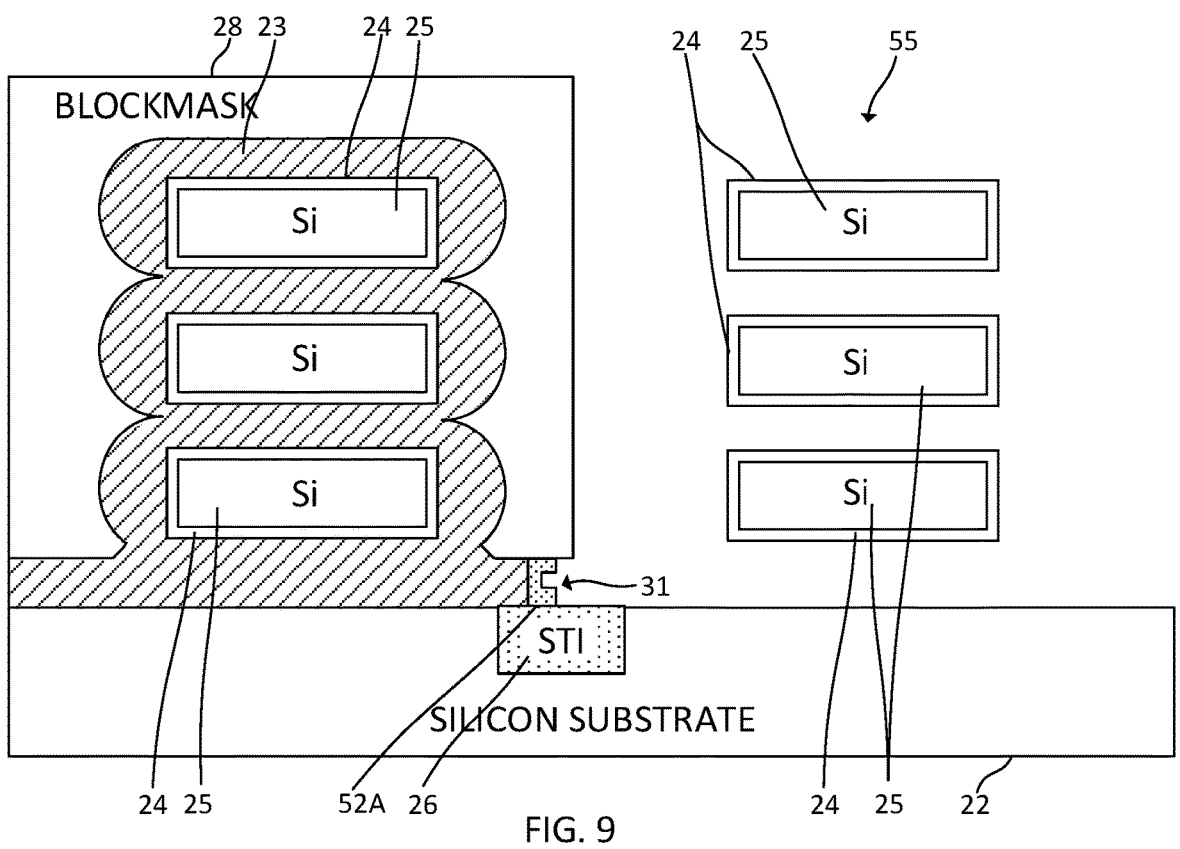
FIG. 9 is a schematic, cross-sectional view thereof following a second metal etch of the structure shown in FIG. 8.
Figure 10:
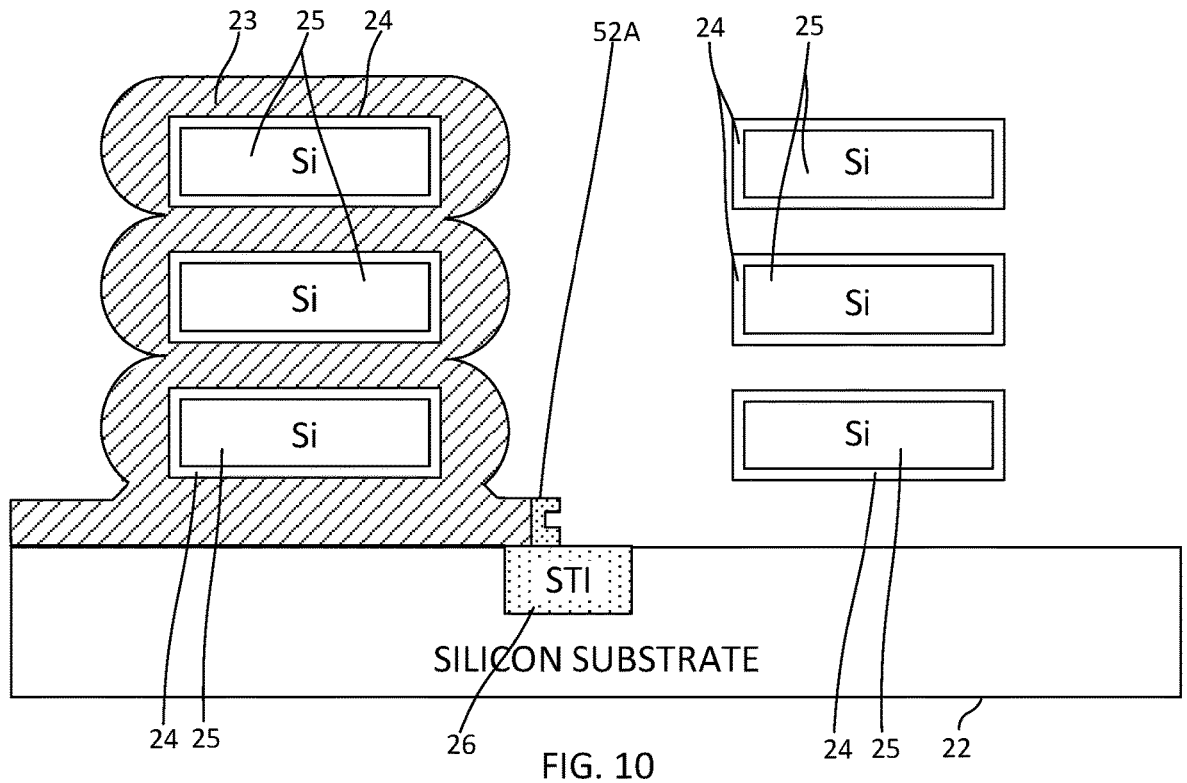
FIG. 10 is a schematic, cross-sectional view thereof following removal of the mask from the structure shown in FIG. 9.
Figure 11:
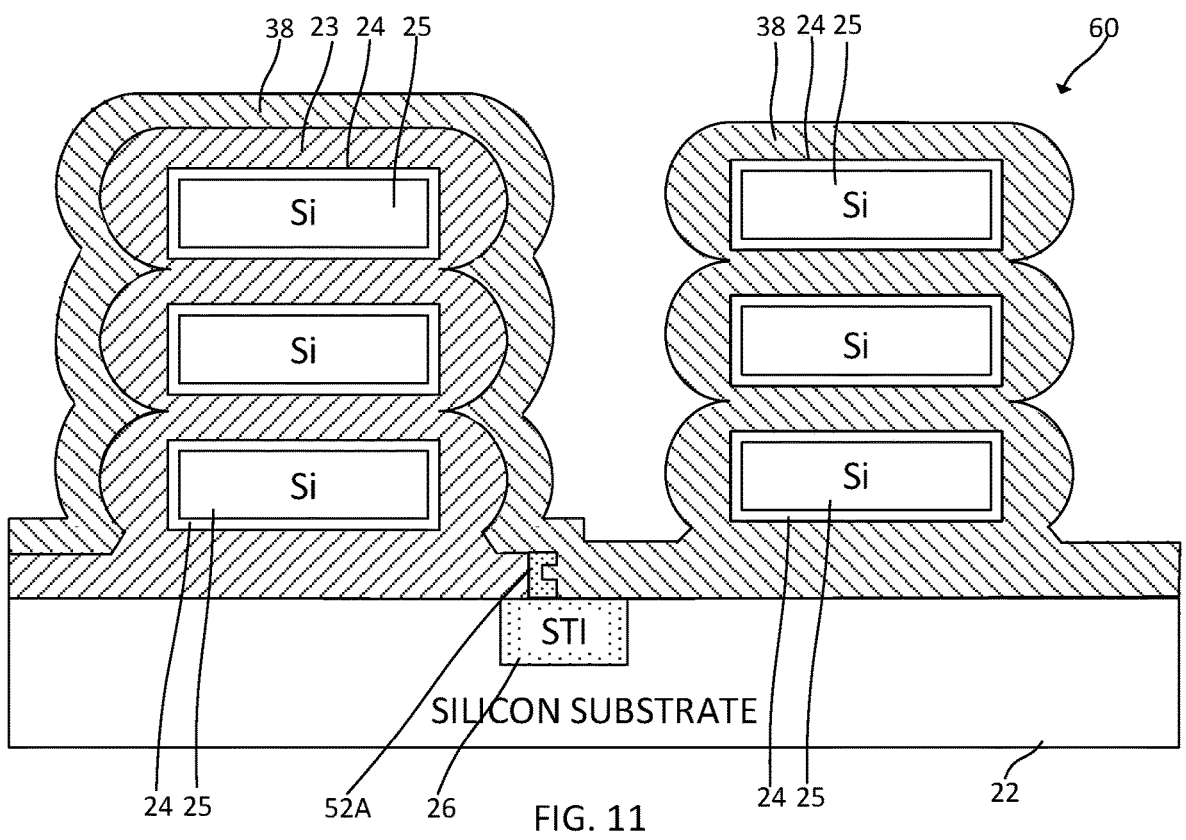
FIG. 11 is a schematic, cross-sectional view thereof following deposition of a metal layer on the semiconductor structure shown in FIG. 10.

Referring to FIG. 8, the structure 50 shown in FIG. 7 is subjected to an etching process that causes the removal of the liner 52 from all portions of the structure except within the recess. While the opening to the recess 31 beneath the mask may no longer be blocked by liner material following the etching process, sufficient liner material will remain within the recess to protect the metal layer 23 beneath the mask 28. Etching of oxide liners may be conducted using a diluted hydrofluoric acid (HF) solution or by an isotropic reactive ion etch that leaves residual oxide material 52A in the recess to protect the metal. A second gate metal wet etch is then performed to remove the remainder of the gate metal 23 from the unprotected region while the metal beneath the mask remains intact due to the mask 28 and the presence of the residual liner material 52A in the recess 31 beneath the mask. A structure 55 as shown in FIG. 9 is accordingly obtained. The mask 28 is then stripped as shown in FIG. 10 followed by deposition of a second WFM layer 38 to obtain a dual work function metal gate CMOS transistor structure 60 as shown in FIG. 11. Plasma ashing with a nitrogen/hydrogen gas combination may be employed to remove the soft mask.

Figure 12:
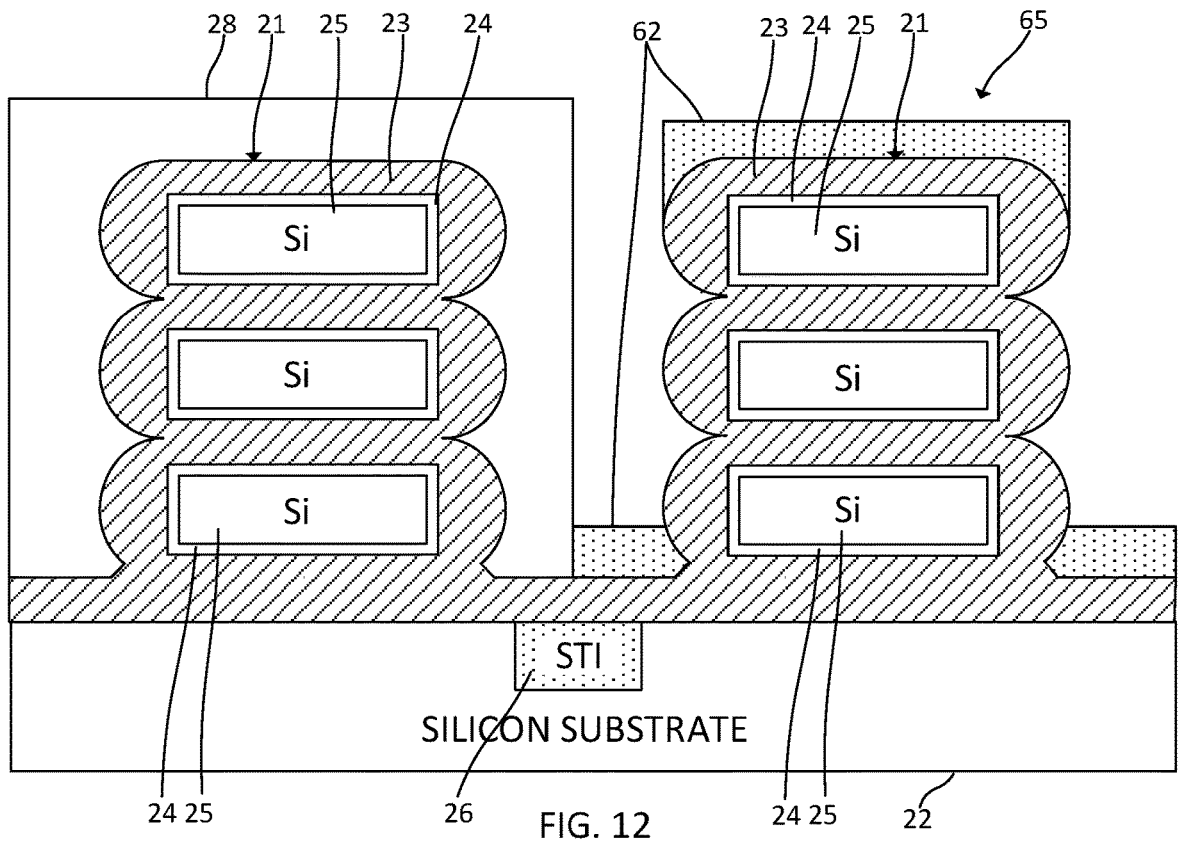
FIG. 12 is a schematic, cross-sectional view of the semiconductor structure shown in FIG. 1 following deposition of an etch resistant material on one of the adjoining regions of the semiconductor substrate.
Figure 13:
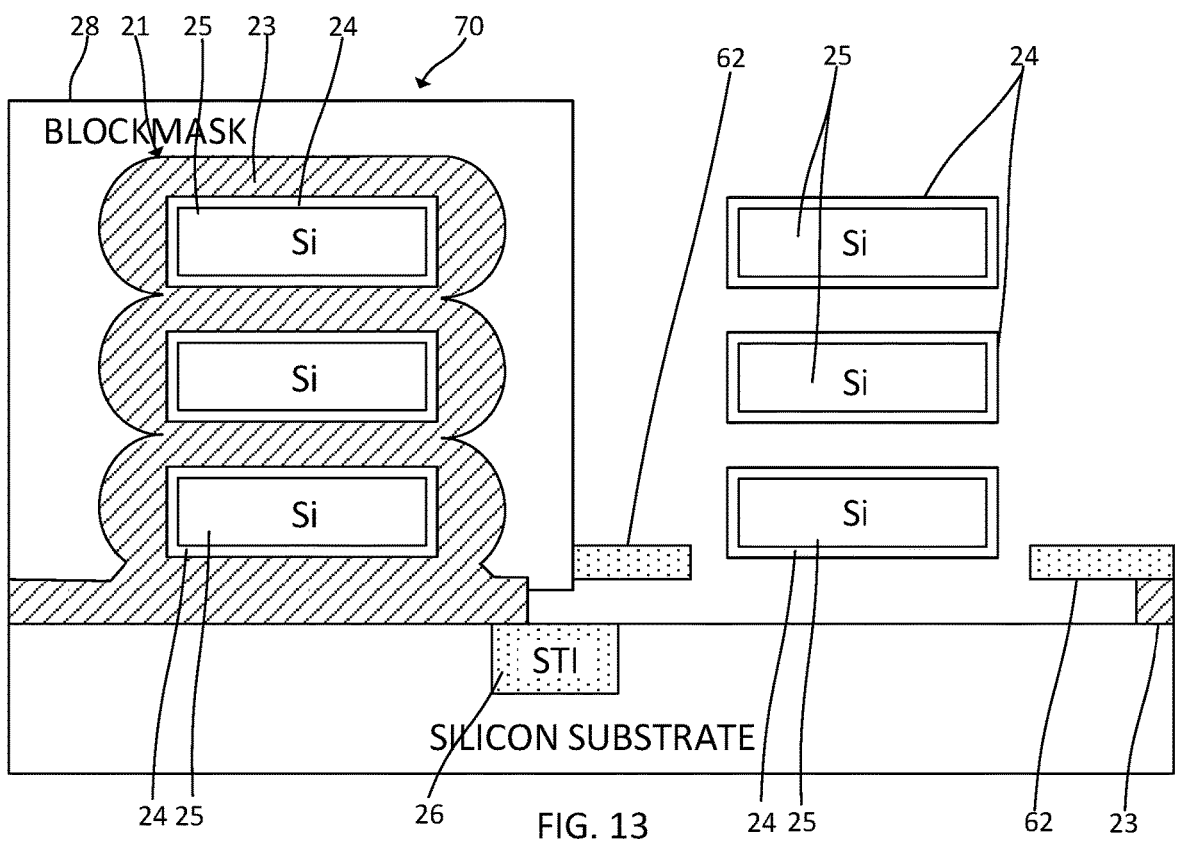
FIG. 13 is a schematic, cross-sectional view thereof following removal of gate metal from the one of the adjoining regions of the semiconductor substrate.
Figure 14:
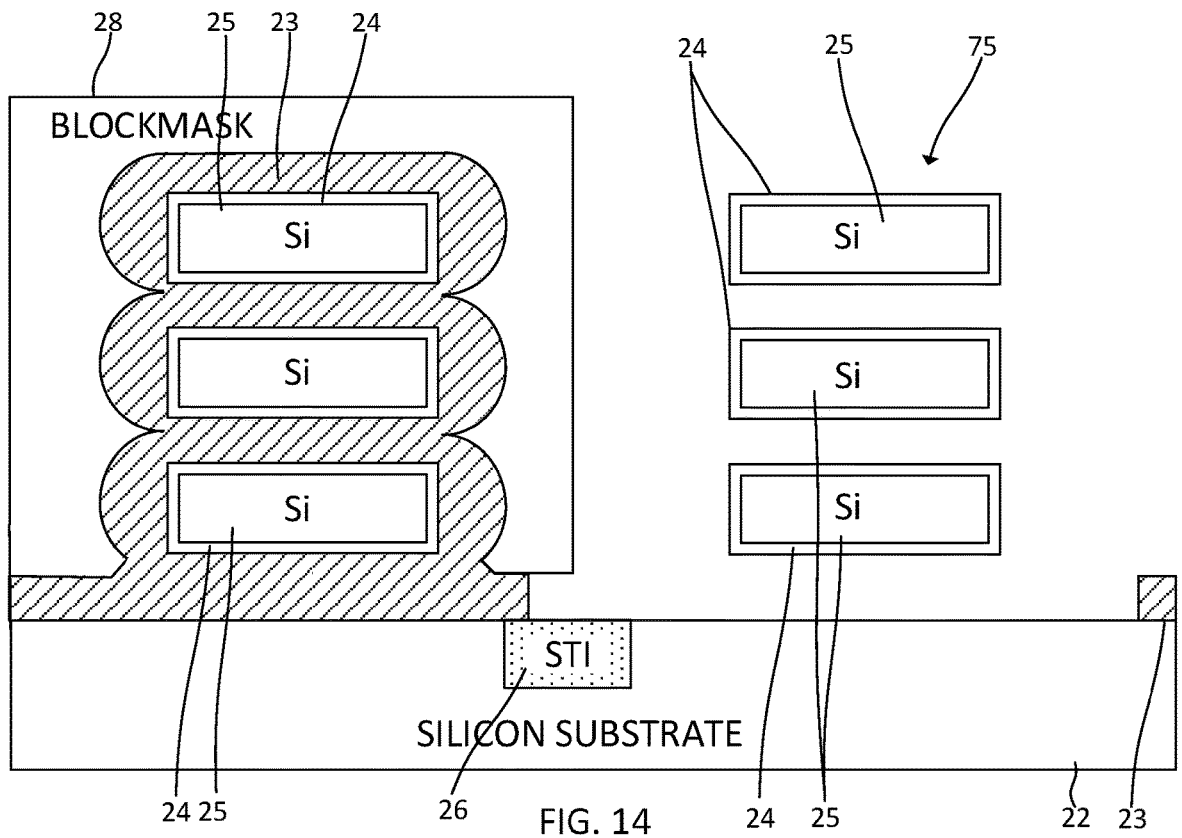
FIG. 14 is a schematic, cross-sectional view thereof following removal of the etch resistant material from the structure shown in FIG. 13.

FIGS. 12-14 schematically illustrate a further gate patterning process for removing work function metal from a first region (e.g. nFET region) of a structure including nanosheet FET structures 21 while preventing removal of such metal from a second region (e.g. pFET region) of the structure. The structure 65 shown in FIG. 12 is obtained by depositing an etch-resistant material on a structure 20 as shown in FIG. 1. The etch-resistant material, for example an oxide such as, for example, SiO2 formed by atomic layer deposition (ALD), will form a layer 62 on the top surface of the nanosheet FET 21 that is unprotected by the blockmask 28 as well as the top surface of the metal layer 23 adjoining the substrate 22 when deposited using a directional sputtering technique. Alternatively, a flowable oxide can be deposited on the structure 20, filling the gap between the nanosheet FET structures. The flowable oxide will form a layer 62 of etch resistant material on the metal layer 23 adjoining the substrate 22 but not atop the nanosheet FET structure 21 (not shown). Flowable oxide materials are commercially available and known to those of skill the art. The metal layer 23 in the unblocked region accordingly includes exposed portions and protected metal portions following deposition of the etch-resistant material layer 62. When the structure 65 is subjected to a wet etch solution for sufficient time, the gate metal portions of the metal layer 23 as well as the portion of the metal layer 23 adjoining the substrate 22 are entirely removed. In embodiments including an etch-resistant layer portion or "cap" on the nanosheet FET structure 21, the cap is lifted off the FET structure during the wet etch while the portions. The portions of the etch-resistant layer 62 adjoining the metal layer 23 on the top surface of the substrate 22 remains intact during much if not all of the wet etch that removes the metal from the unblocked region. The top surface of the metal layer 23 under these portions of the etch-resistant layer 62 is accordingly protected. Etching of the metal beneath the etch-resistant layer 62 therefore proceeds only laterally. Because the etchant has to proceed a greater lateral distance than is required without the use of a protective, etch-resistant layer 62 as described, etching of metal beneath the blockmask 28 is limited. In contrast, the absence of such a protective layer may cause undesirable over-etching as schematically illustrated in FIG. 15. A structure 70 as schematically illustrated in FIG. 13 is ideally obtained through the use of the etch-resistant, protective layer 62. The exemplary structure 70 includes only limited recessing of the metal beneath the blockmask 28 and no etching of the gate metal portion that adjoins the dielectric layers 24 protected by the blockmask 28. The metal layer 23 is accordingly completely removed on one region of the substrate (for example, the nFET region) while it remains substantially intact over the other substrate region (for example, the pFET region). While only a single metal etch process is required in this exemplary process, excessive over-etching that adversely affects the nanosheet FET structure 21 covered by the blockmask 28 cannot be tolerated. Process control of the single metal etch process is accordingly more difficult than when using the two separate metal etch processes as described above with respect to FIGS. 1-6 and 7-11, respectively. The etch-resistant material is removed from the structure 70 to obtain the structure 75 shown in FIG. 14. The fabrication process can then continue as described above with respect to FIGS. 5 and 6.

Further processing of the structure shown in FIG. 6 or a similar structure obtained using one of the alternative process described herein can include the formation of doped source/drain regions and spacers and cap layers (not shown) protecting the gates of the nanosheet FET structures during source/drain contact formation. Dielectric caps can prevent shorting between the metal gate and the subsequently formed self-aligned contacts. A silicon nitride (Si3N4) layer (not shown) can be deposited via CVD, PECVD, sputtering, or other suitable technique to form the spacers. The spacers can be formed by any method known in the art, including depositing a conformal nitride layer and removing unwanted material using an anisotropic etching process such as reactive ion etching or plasma etching. The cap layer may also be a nitride layer. A gate contact layer (for example, W metallization) may also be provided on the top surface of each nanosheet stack. Source/drain formation and contact formation techniques having applicability to nanosheet transistors and other types of transistors are known to the art and continue to be developed.

While the fabrication process has been described with respect to gate metal patterning in structures including nanosheet transistors, those of skill in the art will appreciate that it can also be applied to structures including other types of field-effect transistors, including vertical FETs and tri-gate FinFETs.

FIGS. 1-14, as discussed above, depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., Silicon VLSI Technology: Fundamentals, Practice, and Modeling 1st Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary fabrication method includes obtaining a structure 20 including a substrate 22 having a first region and a second region, for example adjoining pFET and nFET regions 30, 32 as shown in FIG. 2A. A first FET structure 21 on the first region of the substrate includes a semiconductor channel region 25 and a dielectric layer 24 adjoining the semiconductor channel region. A second FET structure 21 on the second region of the substrate also includes a semiconductor channel region and a dielectric layer adjoining the semiconductor channel region. A first gate metal layer 23 extends over the first and second regions of the substrate and adjoins the dielectric layers 24 of the first and second FET structures 21. The structure 20 further includes a mask 28 covering the first FET structure. An exemplary structure 20 is shown in FIG. 1. The structure is subjected to an etching process as schematically illustrated in FIG. 2A, thereby: 1) removing a first portion of the first gate metal layer from between the mask 28 and the substrate 22/23, thereby forming a recess 31 between the mask and the substrate, and 2) partially removing a second portion of the first gate metal layer 23 from the second FET structure while leaving a remaining portion of the first gate metal layer thereon. FIG. 2B shows the structure following a first wet etch. The recess 31 is sealed to protect the gate metal layer 23 beneath the mask. FIGS. 3 and 8 show exemplary structures including sealed recesses. Subsequent to sealing the recess 31, the remaining portion of the first gate metal layer 23 is removed from the second FET structure 21 to obtain a structure 35 as shown in FIG. 4 or, alternatively, a structure 55 as shown in FIG. 9. A second wet etch may be employed. The mask 28 is removed subsequent to removing the remaining first portion of the first metal gate layer as shown in FIGS. 5 and 10 and a second gate metal layer 38 is formed on the first and second FET structures, the second gate metal layer 38 having a different work function value than the first gate metal layer 23. FIGS. 6 and 11 schematically illustrate structures 40, 60 obtained once the second gate metal layer is deposited. The first and second FET structures are nanosheet field-effect transistor structures in one or more embodiments, as shown in FIGS. 1 and 7. The substrate further includes a shallow trench isolation region 26 separating the first and second regions in some embodiments. In some embodiments, sealing the recess 31 includes reflowing the mask 28, thereby obtaining a structure as shown in FIG. 3. In other embodiments, sealing the recess includes depositing a liner 52 on the structure as shown in FIG. 7 such that a portion of the liner (52A in FIG. 8) extends within the recess and seals the first gate metal layer beneath the mask. The liner is removed from the structure such that the portion of the liner 52A that seals the first gate metal layer 23 beneath the mask 28 remains. The liner 52 is an oxide liner deposited using atomic layer deposition in some embodiments. In some embodiments, each of the first and second FET structures includes a stack of nanosheet channel layers 25, wherein partially removing the first portion of the first gate metal layer 23 from the second FET structure includes introducing a wet etch solution (29 in FIG. 2A) to the second FET structure (in the nFET region 32 in FIG. 2A) and removing the wet etch solution while the remaining portion of the first gate metal layer 23 remains between each of the nanosheet channel layers as shown in FIG. 2B.

A further exemplary fabrication method includes obtaining a structure such as the structure shown in FIG. 1 and depositing a protective layer 62 partially covering the first metal gate layer 23 extending over the second region of the substrate 22. FIG. 12 shows an exemplary structure 65 including a protective layer 62 on the second region and a mask 28 on the first region. The structure 65 is subjected to an etching process subsequent to depositing the protective layer 62, thereby removing the first gate metal layer 23 from the second region while leaving the first portion of the gate metal layer beneath the mask 28. (See FIG. 13.) The mask 28 is removed subsequent to removing the first metal gate layer 23 from the second FET structure and a second metal gate layer is formed on the first and second FET structures, the second metal gate layer having a different work function value than the first metal gate layer. The protective layer is deposited by sputtering in some embodiments and as a flowable oxide in other embodiments.

A monolithic structure is further provided that includes dual work function transistor structures. The monolithic structure includes a substrate 22 having a first region and a second region, for example electrically isolated nFET and pFET regions. A first nanosheet field-effect transistor structure, for example FET structure 21A in FIG. 6, is on the first region of the substrate and includes a semiconductor channel region comprising a stack of nanosheet channel layers 25, gate dielectric layers 24 respectively adjoining each of the channel layers, a first gate metal layer 23 adjoining the gate dielectric layers, and a first portion of a second gate metal layer 38 extending over the first gate metal layer 23. The monolithic structure further includes a second nanosheet field-effect transistor structure (21B in FIG. 6) on the second region of the substrate 22, the second nanosheet field-effect transistor structure including a semiconductor channel region comprising a stack of nanosheet channel layers 25, gate dielectric layers 24 respectively adjoining each of the channel layers, and a second portion of the second gate metal layer 38 adjoining the gate dielectric layers 24. The second gate metal layer 38 has a work function value different from the work function value of the first gate metal layer 23. The substrate further includes a shallow trench isolation region 26 separating the first and second regions in some embodiments.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating dual work function metal gate transistors, comprising:
    obtaining a first structure including:
        a substrate having a first region and a second region,
        a first FET structure on the first region of the substrate, the first FET structure including a semiconductor channel region and a dielectric layer adjoining the semiconductor channel region,
        a second FET structure on the second region of the substrate, the second FET structure including a semiconductor channel region and a dielectric layer adjoining the semiconductor channel region,
        a first gate metal layer having a first portion extending over the first region of the substrate and a second portion extending over the second region of the substrate, the first gate metal layer further adjoining the dielectric layers of the first and second FET structures, and
        a mask covering the first FET structure;
    depositing a protective layer partially covering the first gate metal layer extending over the second region of the substrate;
    subjecting the first structure to an etching process subsequent to depositing the protective layer, thereby removing the second portion of the first gate metal layer while leaving the first portion of the first gate metal layer intact;
    removing the mask subsequent to removing the first gate metal layer from the second FET structure, and
    forming a second gate metal layer on the first and second FET structures, the second metal gate layer adjoining the dielectric layer of the second FET structure and having a different work function value than the first metal gate layer.

2. The method of claim 1, wherein depositing the protective layer includes depositing flowable oxide material.

3. The method of claim 1, wherein depositing the protective layer includes directionally sputtering the protective layer over the second region of the substrate.

4. The method of claim 1, wherein the first and second FET structures are nanosheet field-effect transistor structures.

5. The method of claim 1, wherein each of the first and second FET structures includes a stack of nanosheet channel layers, the stack of nanosheet channel layers of the first FET structure being spaced from the stack of nanosheet channel layers of the second FET structure by a distance between 30 nanometers and 50 nanometers.

6. The method of claim 5, wherein the nanosheet channel layers have widths between 10 nanometers and 50 nanometers.

\* \* \* \* \*